United States Patent
Abraham et al.

(10) Patent No.: US 9,531,055 B2
(45) Date of Patent: Dec. 27, 2016

(54) REMOVAL OF SPURIOUS MICROWAVE MODES VIA FLIP-CHIP CROSSOVER

(71) Applicant: International Business Machines Corporation, Armonk, NY (US)

(72) Inventors: David W. Abraham, Croton-On-Hudson, NY (US); Jerry M. Chow, White Plains, NY (US); Antonio D. Corcoles Gonzalez, Mount Kisco, NY (US); George A. Keefe, Cortlandt Manor, NY (US); Mary E. Rothwell, Ridgefield, CT (US); James R. Rozen, Peekskill, NY (US); Matthias Steffen, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 2 days.

(21) Appl. No.: 14/610,476

(22) Filed: Jan. 30, 2015

(65) Prior Publication Data
US 2016/0204330 A1   Jul. 14, 2016

Related U.S. Application Data

(62) Division of application No. 13/838,324, filed on Mar. 15, 2013, now Pat. No. 9,219,298.

(51) Int. Cl.
| | | |
|---|---|---|
| *H01L 29/06* | (2006.01) | |
| *H01L 29/08* | (2006.01) | |
| *H01L 31/0256* | (2006.01) | |
| *H01L 39/22* | (2006.01) | |
| *H01P 7/08* | (2006.01) | |
| *H01L 39/24* | (2006.01) | |
| *H01P 11/00* | (2006.01) | |

(Continued)

(52) U.S. Cl.
CPC ............... *H01P 7/086* (2013.01); *B82Y 10/00* (2013.01); *H01L 39/14* (2013.01); *H01L 39/223* (2013.01); *H01L 39/2406* (2013.01); *H01P 3/003* (2013.01); *H01P 3/026* (2013.01); *H01P 11/003* (2013.01)

(58) Field of Classification Search
None
See application file for complete search history.

(56) References Cited

U.S. PATENT DOCUMENTS

| | | |
|---|---|---|
| 5,075,655 A | 12/1991 | Pond et al. |
| 5,168,078 A | 12/1992 | Reisman et al. |

(Continued)

FOREIGN PATENT DOCUMENTS

WO  2012011230 A1   1/2012

OTHER PUBLICATIONS

David Abraham, et al., "Cross-Talk in Superconducting Transmon Quantum Computing Architecture," American Physical SOciety, APS March Meeting 2013, Abstract Only, p. 1-1.

(Continued)

*Primary Examiner* — Mohammad Islam
*Assistant Examiner* — Jay C Chang
(74) *Attorney, Agent, or Firm* — Cantor Colburn LLP; Vazken Alexanian

(57) ABSTRACT

A coplanar waveguide device includes a coplanar waveguide structure disposed on a substrate, at least one qubit coupled to the coplanar waveguide structure and an add-on chip having a metallized trench, and disposed over the substrate.

11 Claims, 7 Drawing Sheets

(51) Int. Cl.
*H01P 3/02* (2006.01)
*B82Y 10/00* (2011.01)
*H01L 39/14* (2006.01)
*H01P 3/00* (2006.01)

(56) References Cited

U.S. PATENT DOCUMENTS

| | | | |
|---|---|---|---|
| 5,485,029 | A | 1/1996 | Crabbe et al. |
| 5,611,008 | A | 3/1997 | Yap |
| 5,821,836 | A | 10/1998 | Katehi et al. |
| 5,990,768 | A * | 11/1999 | Takahashi ............... H01P 3/084 257/664 |
| 6,130,483 | A | 10/2000 | Shizuki et al. |
| 6,258,715 | B1 | 7/2001 | Yu et al. |
| 6,479,139 | B1 | 11/2002 | Claeson et al. |
| 6,589,802 | B1 | 7/2003 | Asada et al. |
| 6,674,347 | B1 | 1/2004 | Maruhashi et al. |
| 6,713,695 | B2 | 3/2004 | Kawai et al. |
| 6,844,236 | B2 | 1/2005 | Ivanov et al. |
| 6,888,063 | B1 | 5/2005 | Lien et al. |
| 7,052,939 | B2 | 5/2006 | Huang et al. |
| 7,307,497 | B2 | 12/2007 | Joodaki |
| 7,400,222 | B2 | 7/2008 | Kwon et al. |
| 8,125,058 | B2 | 2/2012 | Mueller et al. |
| 8,169,059 | B2 | 5/2012 | Barth et al. |
| 2001/0023943 | A1 | 9/2001 | Zagoskin |
| 2002/0158704 | A1* | 10/2002 | Ye ..................... H01P 1/20381 333/99 S |
| 2005/0057327 | A1 | 3/2005 | Kwon et al. |
| 2009/0099025 | A1 | 4/2009 | Uchaykin |
| 2010/0207236 | A1 | 8/2010 | Hebras |
| 2010/0224958 | A1 | 9/2010 | Tiemeijer |
| 2010/0225436 | A1 | 9/2010 | Papavasiliou et al. |
| 2010/0241780 | A1 | 9/2010 | Friesen |
| 2011/0175061 | A1 | 7/2011 | Berkley et al. |
| 2012/0124432 | A1* | 5/2012 | Pesetski ............... G06N 99/002 714/709 |
| 2012/0319085 | A1 | 12/2012 | Gambetta et al. |
| 2014/0264287 | A1 | 9/2014 | Abraham et al. |
| 2014/0274725 | A1 | 9/2014 | Abraham et al. |

OTHER PUBLICATIONS

J. S. Hamel et al., "Substrate crosstalk suppression capability of silicon-on-insulator substrates with buried ground planes (GPSOI)," IEEE Microwave and Guided Wave Letters, vol. 10, Issue 4, Apr. 2000, pp. 134-135.

Jay M. Gambetta, et al., "Characterization of Addressability by Simultaneous Randomized Benchmarking," Phys. Rev. Lett. 109, 240504, Dec. 11, 2012, pp. 1-10.

M.-K. Kim, "Crosstalk control for microstrip circuits on PCBs at microwave frequencies," 1995 IEEE International Symposium on Electromagnetic Compatibility, Aug. 14-18, 1995, pp. 459-464.

PCT International Search Report and Written Opinion; International Application No. PCT/US 14/12694; International Filing Date: Jan. 23, 2014; Date of Mailing: May 7, 2014; pp. 1-20.

S. Blanvillain et al., "Suppressing on-chip electromagnetic crosstalk for spin qubit devices," Journal of Applied Physics, vol. 112, Issue 6, 2012, 064315, 6 pages.

* cited by examiner

REMOVAL OF SPURIOUS MICROWAVE MODES VIA FLIP-CHIP CROSSOVER

DOMESTIC PRIORITY

This application is a divisional of U.S. patent application Ser. No. 13/838,324, filed Mar. 15, 2013, the disclosure of which is incorporated by reference herein in its entirety.

FEDERAL RESEARCH STATEMENT

This invention was made with Government support under Contract No.: W911NF-10-1-0324 awarded by the U.S. Army. The Government has certain rights in this invention.

BACKGROUND

The present invention relates to coplanar waveguides, and more specifically, to universal flip-chip crossover systems and methods for removal of spurious microwave modes in coplanar waveguides.

Coplanar waveguide (CPW) layouts are becoming commonplace in superconducting qubit quantum computing designs. Superconducting CPW resonators can be made with high quality factors (Q), in excess of 100,000 or more. Furthermore, the large ground planes help confine the electromagnetic mode in a relevant region of interest.

A typical CPW resonator includes a center conductor of defined length and two adjacent ground planes. Simple single CPW resonator structures include either one or two ports, as well as two large continuous ground planes. The resonator is addressed via capacitive coupling to the ports via CPW microwave feedlines. Depending on half-wave or quarter-wave configuration, determined by how the center conductor is terminated (i.e., open or short), the cavity and its relevant modes are predictable. However, microwave electromagnetic (EM) simulations reveal the presence of other spurious on-chip modes, including differential slotline modes, which can travel along the large ground planes. For multiple CPW resonators on the same chip, more and more such parasitic EM modes are present since each CPW resonator contributes additional ground planes that are not well connected and therefore are not isopotential at different frequencies. For most applications, especially those involving superconducting circuits, the presence of such modes is detrimental to the operation and measurement of the superconducting circuits.

Conventional techniques for removing unwanted modes involve the use of wire-bond straps, using an aluminum bond wire to attach from one piece of ground plane onto the other, spanning across the center conductor. Often just a few well-placed bonds can greatly mitigate the presence of these modes. However, this is only a trivial solution for simple designs such as those for a single CPW cavity. For more complicated structures wire bonds are not feasible, often due to space constraints and repeatability concerns.

Another method to deal with parasitic modes uses microfabricated shorting straps connecting the ground planes together, thereby performing the same role as the previously mentioned wirebonds but avoiding the tedious manual wirebonding step. These straps are fabricated with additional photolithography steps. One of the drawbacks of this method is that a dielectric is required for the crossover in order to prevent shorting to the center conductor. For superconducting circuits at low temperature and low power, most dielectrics have a relatively large dielectric loss tangent and thus could reduce the resonator quality factor and/or qubit performance. In addition, it is difficult to create such a crossover which is adequately spaced from the center conductor so that the resonant properties of the CPW are not affected.

Other techniques exist as well but are even less feasible given the current state-of-the-art. One possibility involves through-vias placed into the substrate. The top ground plane is directly tied to a bottom ground plane. Sufficiently closely spaced through-vias then help tie all ground structures together. However, although the steps are well known to make through-vias, the extra processing steps may be prohibitively time consuming and could also be impossible for substrates such as sapphire, commonly used in superconducting circuits. Similarly, embedded stripline designs involve a multi-layer process that could degrade the device performance.

SUMMARY

Exemplary embodiments include a coplanar waveguide device, including a coplanar waveguide structure disposed on a substrate, at least one qubit coupled to the coplanar waveguide structure and an add-on chip having a metalized pattern-trenched surface, and disposed over the substrate.

Additional exemplary embodiments include a coplanar waveguide device, including a first chip including a patterned coplanar waveguide and a second chip disposed on the first chip, the second chip having a metalized pattern-trenched surface that remove spurious microwave modes from the first chip.

Further exemplary embodiments include a method of fabricating a coplanar waveguide device, the method including fabricating a qubit circuit chip, fabricating an add-on chip configured to remove spurious microwave modes from the qubit circuit chip and disposing the add-on chip on the qubit circuit chip.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the systems and methods described herein implement a cap structure and substrate that support qubits for quantum computing applications. The systems and methods described herein prevent capacitive coupling between remote sections of the circuit and remove spurious microwave modes that are detrimental for quantum computing applications. Qubits in quantum computing circuits include, but are not limited to, thin film elements such as Josephson junctions, interdigitated capacitors and the like. These elements form an anharmonic oscillator and serve to store information. Capacitive coupling between the qubit and CPW resonators allows for interrogation of the state of the qubit, and for actively modifying this state. It is also important for two main reasons that the qubit be isolated from the neighboring elements. First, the qubit coherence time suffers if inadvertent coupling exists between the qubit and other resonant systems, limiting the amount of time available to perform gate operations on the qubit. Second, the qubit is nominally identical to other qubits in the two-dimensional lattice forming the quantum computing system. In order to operate properly, only the resonators with intentional coupling can interact with the qubit, so that the time evolution of the state of the qubit proceeds for the planned measurements. As such, effective isolation of the qubits from the circuit (discounting intentionally designed coupling) is necessary.

Figure 1:
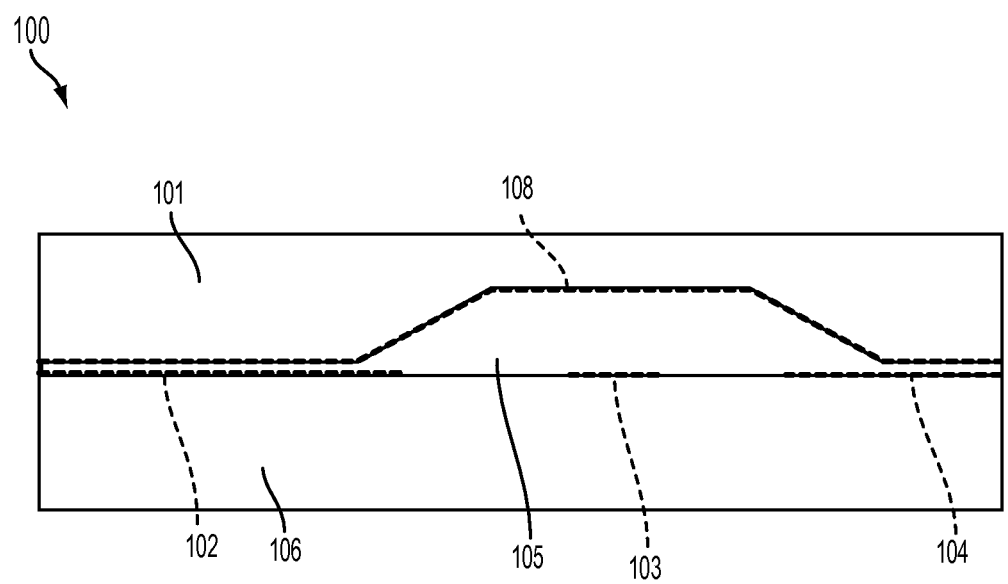
FIG. 1 illustrates a cross-sectional view of an example of an exemplary CPW device for removing spurious microwave modes.

FIG. 1 illustrates a cross-sectional view of an example of an exemplary CPW device 100 for removing spurious microwave modes. In exemplary embodiments, a standard qubit circuit is disposed on a substrate 106, implementing fabrication techniques that yield superconducting qubit devices with acceptable coherence time metrics. The exemplary CPW device 100 includes two ground planes 102, 104 and a center conductor 103. However, it will be appreciated that the ground planes and center conductor configuration described in this example is for illustrative purposes and that other structures including a superconducting qubit and its associated planar structure could be implemented instead of the center conductor of a CPW. In exemplary embodiments, an add-on chip 101 (i.e., cap) is placed on top of the standard chip and substrate 106. The add-on chip 101 includes a cavity 105 that has been etched into the add-on chip 101. In exemplary embodiments, a continuous metallization 108 provides good grounding between the ground planes 102, 104 via a large capacitance that behaves like a short at microwave frequencies.

Figure 2:
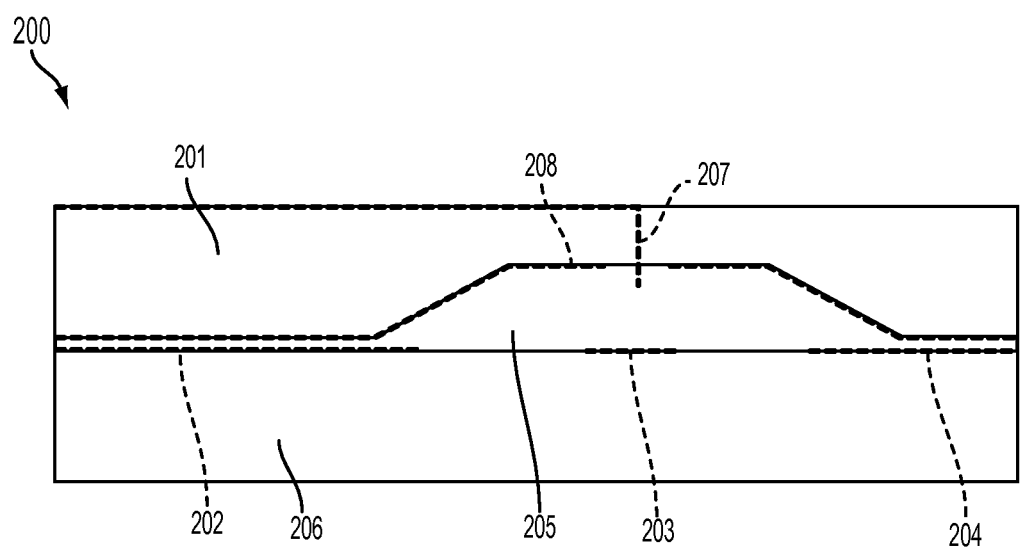
FIG. 2 illustrates a cross-sectional view of another example of an exemplary CPW device for removing spurious microwave modes, including a signal access or control line for introducing and/or reading microwave signals from the device below.

FIG. 2 illustrates a cross-sectional view of another example of an exemplary CPW device 200 for removing spurious microwave modes. The example in FIG. 2 also illustrates a standard qubit circuit that is disposed on a substrate 206, implementing fabrication techniques that yield superconducting qubit devices with acceptable coherence time metrics. The exemplary CPW device 200 includes two ground planes 202, 204 and a center conductor 203. In exemplary embodiments, an add-on chip 201 (i.e., cap) is placed on top of the standard chip and substrate 206. The add-on chip 201 includes a CPW center-conductor matching trench 205 that has been etched into the add-on chip 201. In exemplary embodiments, a continuous metallization 208 provides good grounding between the ground planes 202, 204 via a large capacitance that behaves like a short at microwave frequencies. The example in FIG. 2 further includes control signal line 207 that can provide high frequency microwave signals to the center conductor 203. It will be appreciated that the center conductor 203 can be replaced with a qubit so that the control signal line 207 supplies a qubit with a microwave control signal.

Figure 3:
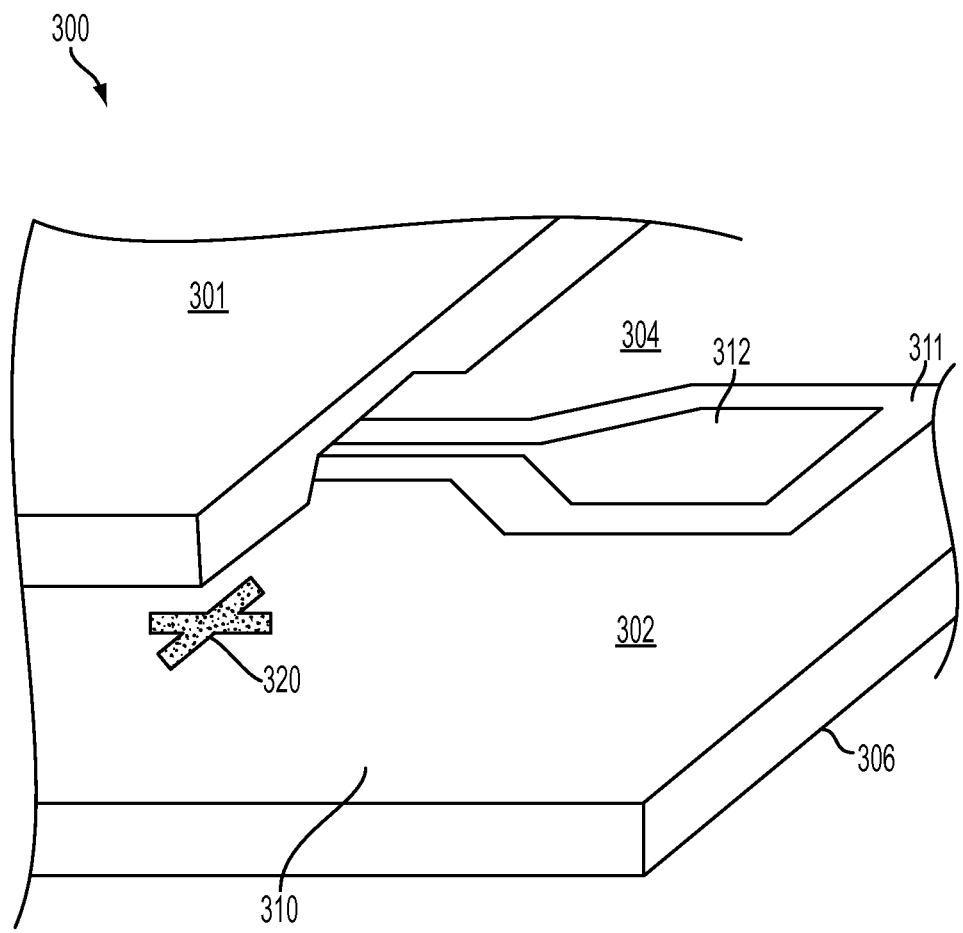
FIG. 3 illustrates a perspective view of another example of an exemplary CPW device for removing spurious microwave modes.

FIG. 3 illustrates a perspective view of another example of an exemplary CPW device 300 for removing spurious microwave modes. The example in FIG. 3 is similar to the examples of FIGS. 1 and 2. The example in FIG. 3 illustrates further details of a standard qubit circuit 310 that is disposed on a substrate 306. The standard qubit circuit 310 includes a ground plane 302, 304 disposed on the substrate 306. The standard qubit circuit 310 further includes a portion of resonator 311 disposed on the substrate 306. The resonator 311 is connected to a drive port 312, which is implemented to drive the resonator and nearby coupled qubits (not shown). The exemplary CPW device 300 further includes an add-on chip 301 and cavity 305, similar to the add-on chips described herein. FIG. 3 illustrates the add-on chip 301 covering only a portion of the substrate 306 and standard qubit circuit 310. As further described herein, the add-on chip 301 can also cover the portion of the resonator 311 and drive pad 312. FIG. 3 further illustrates that the substrate 306 can include alignment marks 320, which allows the add-on chip 301 to be aligned with the substrate 306 during assembly of the CPW device 300.

Figure 4:
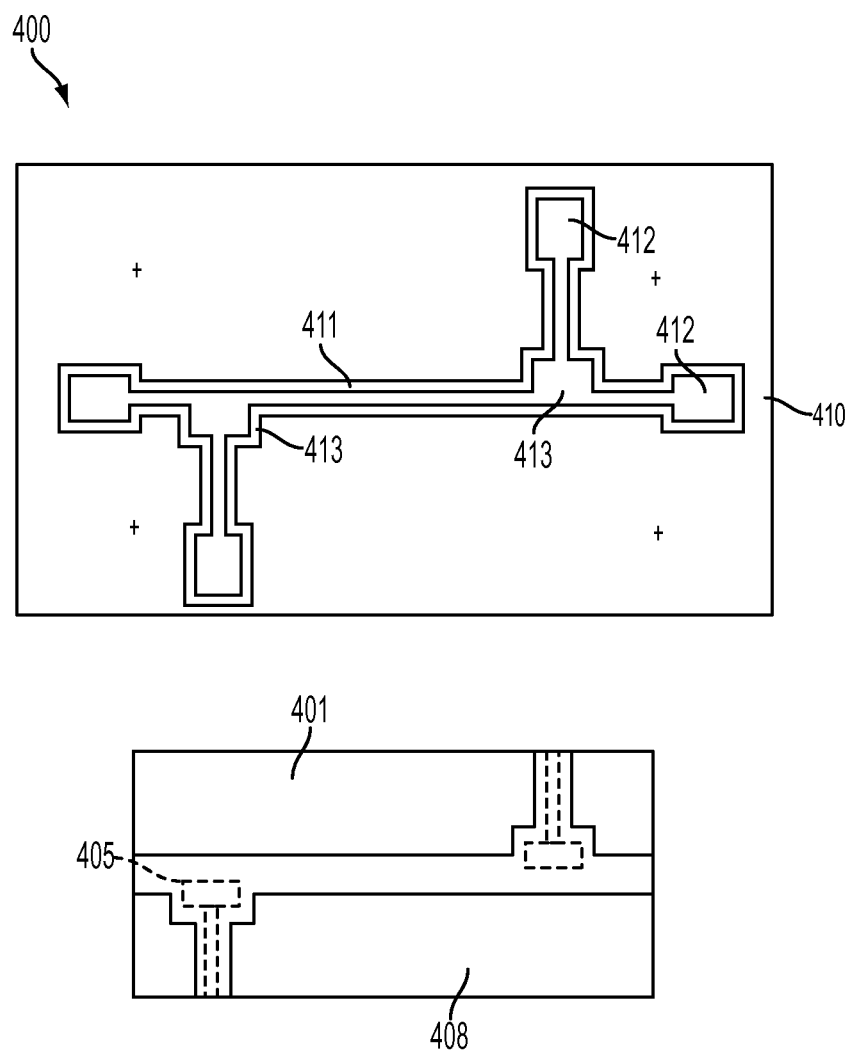
FIG. 4 illustrates a top plan view of an exemplary CPW device for removing spurious microwave modes.

FIG. 4 illustrates a top plan view of an exemplary CPW device 400 for removing spurious microwave modes. FIG. 4 shows a standard qubit circuit 410 disassembled from a corresponding add-on chip 401. FIG. 4 illustrates further details of the standard qubit circuit 410 including portions of a resonator 411, drive pads 412 and qubit pockets 413 into which qubits are disposed. FIG. 4 also illustrates further details of the add-on chip 401 showing that the cavity 405 includes several different portions that match the features (e.g., the resonator 411, and the qubit pockets 413) of the standard qubit circuit 410. As described herein, the standard qubit circuit 410 can be fabricated from a suitable metal such as but not limited to niobium nitride (NbN), titanium nitride (TiN), niobium (Nb) and aluminum (Al), which is patterned on a substrate such as silicon (Si). The metal is patterned to the corresponding CPW structures (e.g., the resonator 411), the drive pads 412 and the qubit pockets 413. As also described herein, the add-on chip 401 includes a continuous metallization 408 which can be Nb, Al or other materials. Further details of fabrication are described herein.

In exemplary embodiments, the systems and methods described herein therefore provide a cap structure (i.e., the add-on chips) that follows the structure of the standard qubit circuits on the respective substrate. Capacitive coupling between active elements on the standard qubit circuit and the cap structure is controllable so that CPW device properties do not fluctuate to an unacceptable amount due to variations in cap dimension, which are expected or which occur in manufacturing. As described herein, the cap structure can cover portions of the standard qubit circuit or the entire standard qubit circuit.

In exemplary embodiments, the cap structure is sized to achieve various functions. First, the cap structure provides an additional capacitance to the qubit LC oscillator. In design, the capacitance of the qubit is reduced in order that the net capacitance (and hence frequency) remains constant. However, since this additional capacitance is determined by proximity of the cavity within the cap structure to the qubit structure, and any errors in size or placement of the cap contributes to a frequency spread. Since qubits are designed to operate at precise frequency, the cap structure is fabricated large enough so that the cap walls are far enough away so that physical placement or size errors contribute relatively less to the qubit capacitance. As such, there is also a reduced size that the cap structure can be. As such, the cap is fabricated deep enough so that the distance from the qubit to the cavity walls either laterally or perpendicular to the surface are about the same. Similar considerations are made for the CPW since frequencies would shift with the cap being present as well. As a further refinement, the capacitive load from the cap along the extended structures such as a coplanar wave guide resonator should be design so that the capacitance per length is approximately constant along the length, so that the mode shape is not significantly altered. Second, the qubit couples to the environment via the capacitance to the ground shield provided by the cap structure. Any source of dissipation in the cap structure or connected structures causes decoherence in the qubit. Decoherence is undesirable in qubit operation. As such, reducing the capacitance to the point where this decoherence (due to Purcell loss) drives the cap structure to larger dimensions.

In exemplary embodiments, the cross section of the exemplary cap structures described herein can be any suitable shape such as, but not limited to, rectangular, depending in part on the fabrication techniques. For example, reactive ion etching (RIE) results in clean profiles with substantial, uniform depth. Coating the cap structure with superconducting metal is performed if the cap structure is made with Si. For example, the cap structure could be completed by use of high-pressure sputter deposition process to ensure coating on the sidewalls.

In exemplary embodiments, the exemplary cap structures can thus be fabricated without requiring fabrication intensive techniques or novel materials. As described herein, a standard qubit circuit with CPW layouts and other qubit designs patterned in Nb and Al on a $SiO_2$/Si substrate can be implemented with the exemplary cap structures described herein. In exemplary embodiments, the add-on chip is placed upside down on top of the standard qubit circuit chip. The add-on chip can be another piece of $SiO_2$/Si substrate, which is then etched in the locations corresponding to the CPW center striplines, launch pads, and active elements (e.g., qubits) in the standard qubit circuit chip. Subsequent to etching the cavities in the cap structure, the entire $SiO_2$/Si surface is deposited with blanket metallization (e.g. Nb). With sufficient coverage, a continuous side-wall coating into the trench is made. The electrical connection to the circuit chip is possible at DC current because of the native dielectric on the metal surfaces. Even if a DC ground connection is not made, for high frequency currents the effective capacitance formed between the metal of the add-on chip and the ground of the standard qubit circuit chip tie all ground planes together. No explicit dielectrics are (but can be) necessarily implemented and the circuit chip can be fabricated using the standard techniques yielding high performing devices.

In exemplary embodiments, as described herein, the add-on chip can be implemented to bring multiple control signals to the entire CPW device. Losses in the add-on chip above the Nb ground plane do not adversely impact device performance and as such a more complicated photolithographic process is possible for the add-on chip, opening the door for scalable chip design for quantum computing. In addition, it will be possible to stack quantum computing chips and use the cap as a double-sided spacer which serves to both isolate the chips and to provide a path for signal wires to connect neighboring chips. It will be appreciated that various fabrication techniques exist which could be used to fabricate the additional control signals that could be used to apply quantum computing operations on qubits. An example of a fabrication technique is now described in further detail.

Figure 5:
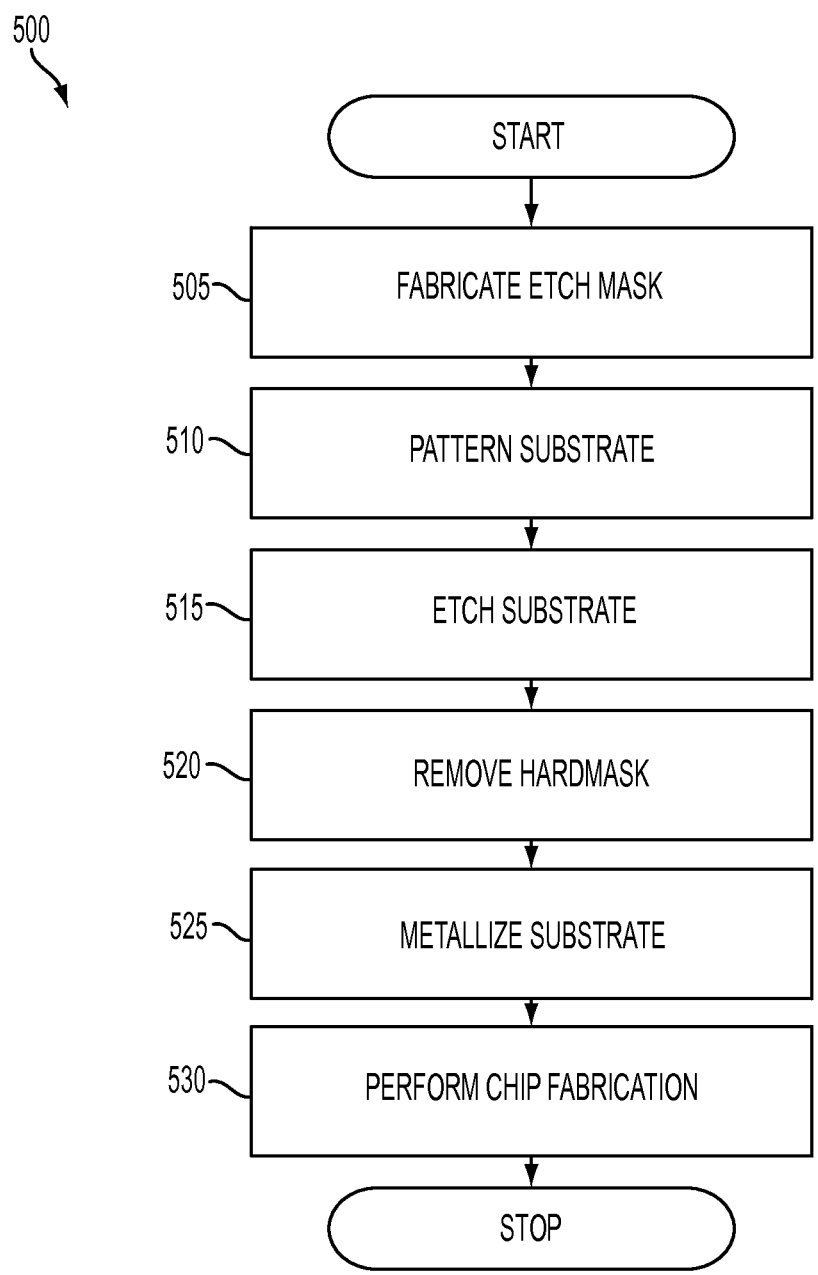
FIG. 5 illustrates a flowchart of a method for fabricating a CPW device cap structure in accordance with exemplary embodiments.
Figure 6A:
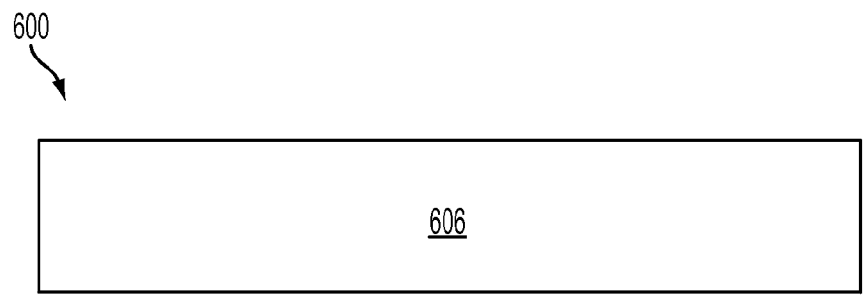
FIG. 6A illustrates a starting structure for an exemplary CPW device cap structure.
Figure 6B:
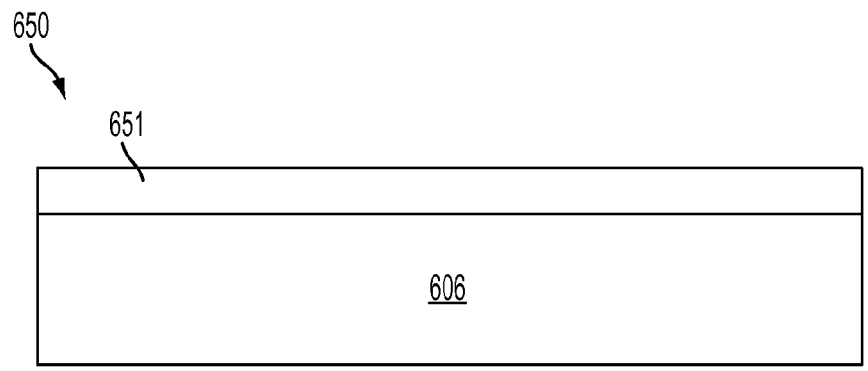
FIG. 6B is an intermediate structure for an exemplary CPW device cap structure.
Figure 6C:
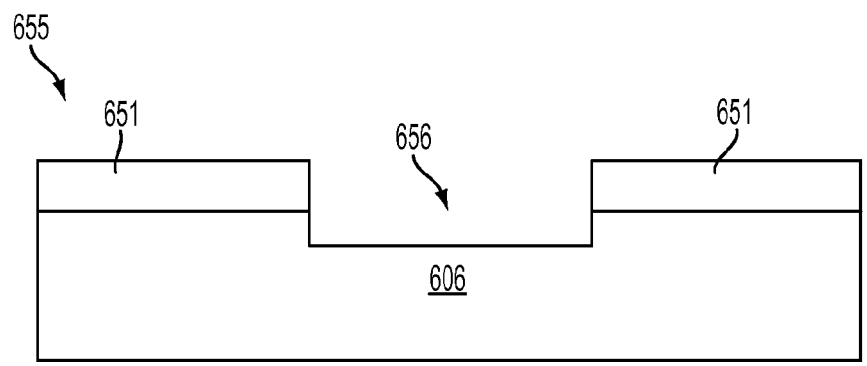
FIG. 6C is an intermediate structure for an exemplary CPW device cap structure.
Figure 6D:
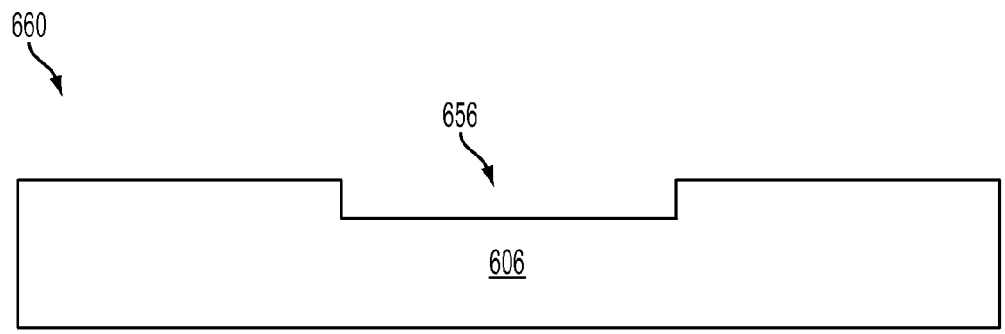
FIG. 6D is an intermediate structure for an exemplary CPW device cap structure.

FIG. 5 illustrates a flowchart of a method 500 for fabricating a CPW device cap structure in accordance with exemplary embodiments. At block 505, a hardmask is fabricated. For example, the hardmask can be $SiO_2$/Si with patterns for etching at locations corresponding to all CPW center conductor and gap channels, all qubit circuit pockets, and any other non-ground plane elements such as coupling capacitors on the standard qubit circuit. FIG. 6A illustrates a starting structure 600 for an exemplary CPW device cap structure. At block 510 of FIG. 5, the substrate 606 for the cap structure is patterned. For example, the substrate can be a 660 µm thick Si wafer. FIG. 6B is an intermediate structure 650 for an exemplary CPW device cap structure. A layer 651 of $SiO_2$ is grown on the substrate 606 as a hard mask. For example, the $SiO_2$ layer can be 1 um of $SiO_2$. FIG. 6C is an intermediate structure 655 for an exemplary CPW device cap structure. At block 515 of FIG. 5, the patterns (represented by pattern 656) from the etch mask of block 505 are formed on the $SiO_2$ layer 651 and substrate 601. Standard photolithography and etching techniques can be implemented to transfer the patterns onto the $SiO_2$ layer. For example, a resist scheme can be 600 Å of developable bottom anti-reflective coating (DBARC) followed by 0.45 µm UV110 positive photoresist. In addition, the patterns are transferred via reactive ion etching (RIE). Photoresist can be stripped using an appropriate solvent. In addition, tetramethyl-ammonium hydroxide (TMAH) can be used for deep trench etching (e.g., 5 µm to 100 µm depth). FIG. 6D is an intermediate structure 660 for an exemplary CPW device cap structure. At block 520 of FIG. 5, the layer 651 (i.e., hardmask) is removed from the substrate 606. For example, a wet etch (i.e., buffered oxide etch typically containing hydrofluoric acid) can be implemented to remove the $SiO_2$.

Figure 6E:
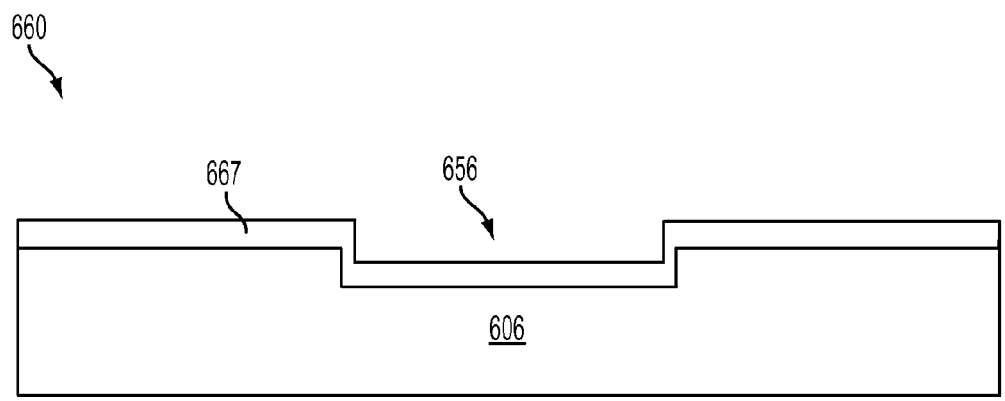
FIG. 6E is an intermediate structure for an exemplary CPW device cap structure.

FIG. 6E is an intermediate structure 665 for an exemplary CPW device cap structure. At block 525 of FIG. 5, the substrate 606 is metallized with a metallic layer 667, such as but not limited to Nb, as described herein. In exemplary embodiments, fabrication techniques are implemented in order to maintain connectedness throughout the deposition so that all areas, including sidewalls, of the substrate are coated. For example, the metallic layer 667 can be blanket sputtered in a uniform layer of about 200 nm to 500 nm. At block 530 of FIG. 5, other fabrication steps are performed. It can be appreciated that on a single wafer, multiple add-on chips can be fabricated. As such, add-on chips are individually diced from the wafer, the actual size of the add-on chips being sized the same or smaller than the standard qubit circuit chips as described herein depending on which components of the standard qubit circuits are to be covered by the add-on chips. Regular circuit chip fabrication is performed as in current standard processes, with the addition of alignment marks on the optical lithography mask to indicate the location of placement for the add-on chips. Assembly involves micromanipulation using probes to accurately place roof chips and affix using amounts of poly(methyl methacrylate) (PMMA) or cyanoacrylate at the corners or along the edges of the roof chip to circuit chip interface. In other exemplary embodiments, possible assembly techniques also include etching pre-patterned holes in both the standard qubit circuit and add-on chips, and performing alignment via a micro pin placed through both chips. Although other Al wirebonds can be implemented, the presence of the add-on chip and standard qubit circuit chip often allows no further need of Al wirebonds.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A coplanar waveguide (CPW) device, comprising:
 a CPW structure disposed on a substrate;
 a qubit coupled to the CPW structure;
 an add-on chip having a metallized cavity, and disposed over the substrate;
 a first ground plane and a second ground plane; and
 a center conductor between the first and second ground planes;
 wherein the add-on chip further comprises a control signal line which is formed within the add-on chip and is electrically connected to the center conductor such that it is configured to provide a control signal to the center conductor.

2. The device of claim 1, wherein the CPW structure comprises:
 a resonator;
 a drive pad coupled to the resonator; and
 a qubit pocket coupled to the resonator.

3. The device of claim 2, wherein the qubit is disposed in the qubit pocket.

4. The device of claim 2, wherein the drive pad is configured to drive the qubit at a pre-defined frequency.

5. The device of claim 1, wherein the CPW structure supports a pre-defined drive frequency for the qubit.

6. The device of claim 5, wherein the CPW structure supports spurious microwave modes.

7. The device of claim 6, wherein the metallized cavity is configured to remove the spurious microwave modes.

8. The device of claim 1, wherein the metallized cavity is electrically coupled to the substrate.

9. The device of claim 1, further comprising:
 a first ground plane and a second ground plane; and
 the qubit disposed between the first and second ground planes.

10. The device of claim 9, wherein the add-on chip further comprises a control signal line configured to provide a control signal to the qubit.

11. The device of claim 1, wherein the metallized cavity comprises Nb.

* * * * *